United States Patent

Watanabe

[11] Patent Number: 5,949,844
[45] Date of Patent: *Sep. 7, 1999

[54] EXPOSURE APPARATUS

[75] Inventor: Yutaka Watanabe, Tochigi-ken, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/898,045

[22] Filed: Jul. 18, 1997

[30] Foreign Application Priority Data

Jul. 19, 1996 [JP] Japan .................................. 8-190914

[51] Int. Cl.[6] .................................................. G03G 15/04
[52] U.S. Cl. .................................................. 378/34; 378/85
[58] Field of Search .................................. 378/34, 84, 85

[56] References Cited

U.S. PATENT DOCUMENTS

| | | | |
|---|---|---|---|
| 5,031,199 | 7/1991 | Cole, III et al. .................... | 378/85 X |
| 5,123,036 | 6/1992 | Uno et al. .................... | 378/34 |
| 5,125,014 | 6/1992 | Watanabe et al. .................... | 378/34 |
| 5,214,685 | 5/1993 | Howells .................... | 378/34 |
| 5,249,215 | 9/1993 | Shimano .................... | 378/34 |
| 5,285,488 | 2/1994 | Watanabe et al. .................... | 378/34 |
| 5,305,364 | 4/1994 | Mochiji et al. .................... | 378/34 |
| 5,371,774 | 12/1994 | Cerrina et al. .................... | 378/34 |
| 5,394,451 | 2/1995 | Miyake et al. .................... | 378/34 |
| 5,444,753 | 8/1995 | Hayashida et al. .................... | 378/35 |
| 5,512,759 | 4/1996 | Sweatt .................... | 378/34 X |
| 5,606,586 | 2/1997 | Amemiya et al. .................... | 378/34 |
| 5,848,119 | 12/1998 | Miyake et al. .................... | 378/34 |

FOREIGN PATENT DOCUMENTS 1-244400  9/1989  Japan .

OTHER PUBLICATIONS

Haelbich, et al., "Design and performance of an x–ray lithography beam line at a storage ring", *J. Vac. Sci Technol.* B1(4), Oct.–Dec. 1983, pp. 1262–1266.

Warren D. Grobman, "Handbook on Synchrotron Radiation", vol. 1, Chap. 13, pp. 1133–1139, North–Holland Publishing Co., 1983.

*Primary Examiner*—David P. Porta
*Attorney, Agent, or Firm*—Fitzpatrick, Cella, Harper & Scinto

[57] ABSTRACT

An exposure apparatus for exposing an object with X-rays from a synchrotron radiation light source includes a first mirror for collecting and reflecting synchrotron radiation light emitted from a synchrotron radiation orbit, and a second mirror for receiving synchrotron radiation light reflected by the first mirror and for projecting it toward the object, the second mirror having a reflection surface which is convex with respect to a direction of emission of synchrotron radiation light as reflected by the first mirror, wherein, when a virtual plane perpendicular to the direction of emission of the synchrotron radiation light reflected by the first mirror is set between a center position of the second mirror and an intermediate position between the center position of the second mirror and the position of the object, the first mirror has a reflection surface of a curvature determined so that a line of intersection between the virtual plane and the synchrotron radiation light from the first mirror becomes parallel to the synchrotron radiation orbit.

15 Claims, 10 Drawing Sheets

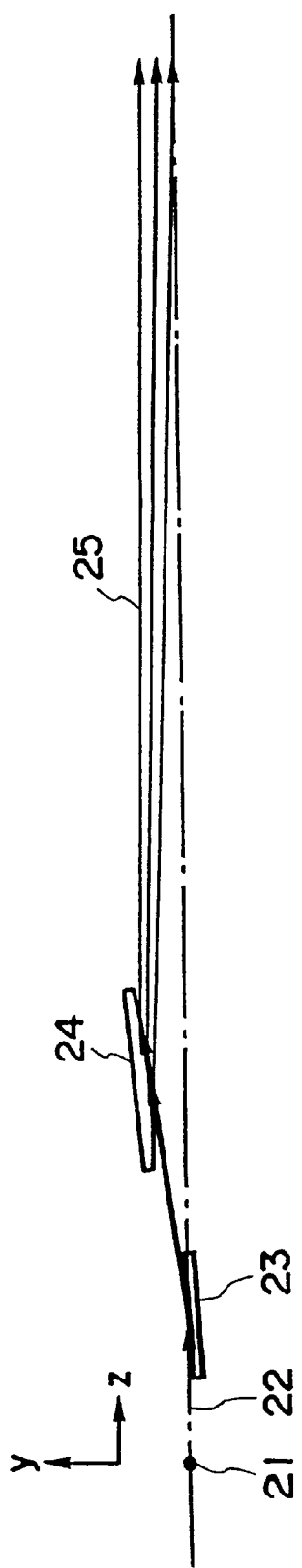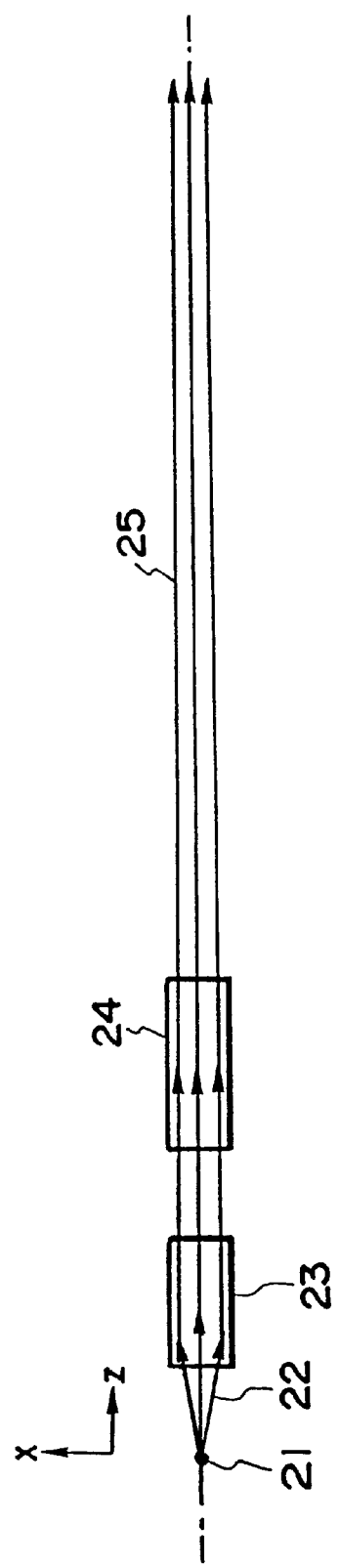

EXPOSURE APPARATUS

FIELD OF THE INVENTION AND RELATED ART

This invention relates to an exposure apparatus and, more particularly, to an exposure apparatus wherein a beam of X-rays or vacuum ultraviolet rays from a light source such as a synchrotron radiation source, for example, is expanded to enlarge an exposure region for an exposure process.

Usually, a synchrotron radiation (SR) light source provides a sheet-like beam of electromagnetic waves (containing X-rays or vacuum ultraviolet rays), which beam has a large divergence angle along an SR orbital plane (hereinafter, this will be referred to as the horizontal direction since, usually, the SR orbital plane is set along a horizontal plane) and a small divergence angle along a direction perpendicular to the SR orbital plane (hereinafter, this will be referred to as the vertical direction). Because of the small divergence angle in the vertical direction, if SR light is projected directly, only a small range in vertical direction can be irradiated with it. In exposure apparatuses using such an SR light source, therefore, there is a necessity of expanding the X-ray exposure area to be irradiated with the SR light source, in the vertical direction.

Examples of this expansion method are:

1) An oblique projection (grazing) mirror is interposed between an SR light source and a surface to be exposed, and the mirror is oscillated by an angle of a few mrad. (R. P. Haelbich, et al.) "J. Vac. Sci. & Technol." B1(4), October –December, 1988, pp.1262–1266).

2) An oblique projection mirror with a shape of a curved surface is interposed between an SR light source and a surface to be exposed, and a divergence angle of an X-ray beam in the vertical direction is enlarged by the reflection of the beam by the curved mirror surface (Warren D. Grobman, "Handbook on Synchrotron Radiation", Vol.1, Chap.13, p.1135, North-Holland Publishing Co., 1983).

3) As an improved form of example 2) above, the mirror shape is changed slightly from a cylindrical shape so that the curvature at a peripheral portion is continuously reduced (Japanese Laid-Open Patent Application, Laid-Open No. 244400/1989). This is intended to enlarge the divergence angle of the X-ray beam in the vertical direction, with an effect of uniform intensity. FIG. 1 shows an exposure apparatus of this example. Denoted in the drawing at 131 is a light emission point, and denoted at 132 is a mirror. Denoted at 133 is a mask. SR light from the emission point 131 is received by a mirror 132 of a specific shape, by which the divergence angle in the vertical direction is enlarged. The light is then projected on the mask 133.

These examples, however, involve some inconveniences. In example 1), only a portion of the surface to be exposed can be irradiated with the beam at any moment. This may cause local expansion of the exposure mask. The effect of such expansion could not be removed unless the mirror vibration period is sufficiently short, and there would remain a difficulty of accurate transfer of a fine pattern. On the other hand, a large drive power is necessary to provide a sufficiently short vibration period. It is practically difficult.

In example 2), on the other hand, the surface to be exposed can be irradiated at once as required. Thus, the problem involved in example 1) can be removed with this method. However, because of the use of a cylindrical mirror shape, there is another problem of a large loss of energy when the beam is expanded. Further, it is difficult to collect the large divergence angle of sheet-like electromagnetic waves in the horizontal direction and, therefore, in this method, with respect to the horizontal direction, the SR light only in an angle defined by the light emission point to the exposure region can be utilized.

As regards example 3), although the problem of a large loss of energy in the beam expansion may be removed with this method, still there is a similar problem that the SR light only in the angle defined by the emission point to the exposure region can be utilized, as in example 2). Although in this method the intensity to be projected to the surface to be exposed can be improved significantly as compared with the example 2), it is still necessary to use some measures to increase the intensity of a light source more or, alternatively, to improve the sensitivity of a resist more. This necessarily results in an increased cost of the SR light source or enlargement of the size of the SR light source. Alternatively, it requires an increase of cost, for development of the resist material.

There is a further example which may be an improved form of example 1) in the point of collecting a large divergence angle of sheet-like electromagnetic waves in the vertical direction. More specifically, an oblique projection mirror is formed with a curvature of a concave surface in a direction perpendicular to an optical axis of SR light, and the mirror is oscillated by an angle of a few mrad. while collecting the SR light. With this method, however, only a portion of the surface to be exposed can be irradiated with the beam at any moment. Thus, there is a similar problem as in example 1), that is, it is difficult to assure accurate transfer of a fine pattern unless the mirror oscillation period is shortened sufficiently.

SUMMARY OF THE INVENTION

It is an object of the present invention to provide an exposure apparatus by which a surface to be exposed as required can be illuminated at once to thereby ensure accurate transfer of a fine pattern, and by which a large divergence angle of SR light (a-sheet-like electromagnetic wave) in a horizontal direction can be collected to thereby assure enlargement of the intensity to be projected to the surface to be exposed and, thus, assure improvement of throughput, without necessity of enlargement of the intensity of the light source.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2B and 2C are schematic views, respectively, for explaining the relation between a light emission point and a mirror, wherein FIG. 2B is a side view and FIG. 2C is a top plan view.

FIGS. 7A and 7B are three-dimensional shape illustrations, for explaining the shape of a mirror in another example, in accordance with the second embodiment of the present invention, wherein FIG. 7A shows the shape of a first mirror and FIG. 7B shows the shape of a second mirror.

FIGS. 10A and 10B are three-dimensional shape illustrations for explaining the shape of a mirror of a third example in the second embodiment of the present invention, wherein FIG. 10A shows the shape of a first mirror and FIG. 10B shows the shape of a second mirror.

DESCRIPTION OF THE PREFERRED EMBODIMENTS

Figure 1:
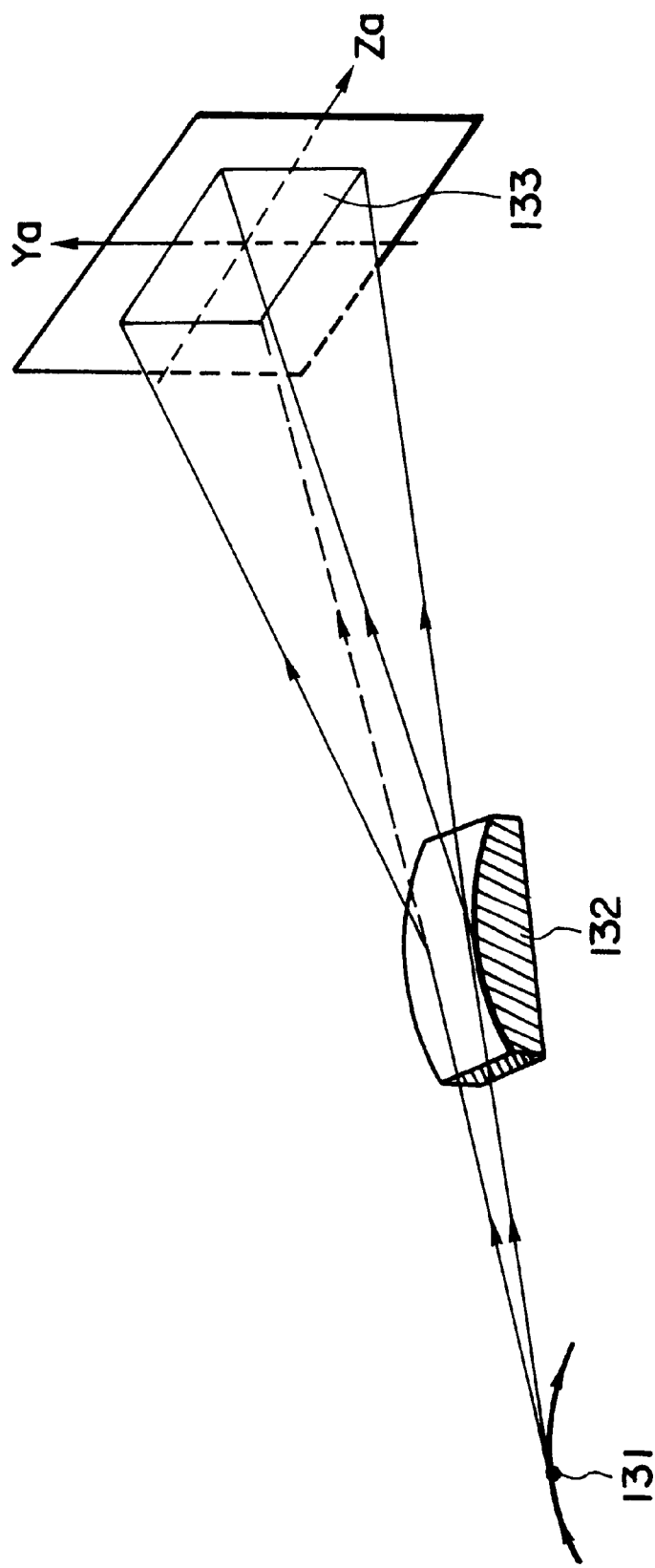
FIG. 1 is a schematic and perspective view of an exposure apparatus of a known type.

Generally, an exposure apparatus according to the present invention may include a synchrotron radiation (SR) light source for providing SR light, containing X-rays or vacuum ultraviolet rays; and a first mirror for reflecting the SR light emitted with a large divergence angle along an SR orbital plane, while collecting it to provide SR light of a shape suitable for illumination of a mask; a second mirror for receiving the SR light reflected by the first mirror and for projecting it toward the mask; wherein a virtual plane perpendicular to the direction of emission of the SR light as reflected by the first mirror may be virtually defined between the center position of the second mirror and a position intermediate between the center position of the second mirror and the mask, wherein the curvature of the reflection surface of the first mirror may be set so that the line of intersection between the virtual plane and the SR light as reflected by the first mirror may be a straight line parallel to the SR orbital plane, and wherein the reflection surface of the second mirror may be convex with respect to the direction of emission of the SR light as reflected.

An embodiment of the present invention may be arranged so that: the distance from the emission point of an SR light source to the center of a first mirror is $l_1$, the distance from the center of the first mirror to the center of a second mirror is $l_2$, the distance from the center of the second mirror to a mask is $l_3$, an oblique incidence angle defined between a principal ray of SR light and a tangent in a principal ray direction at a central portion on the first mirror is $\theta$, a curvature radius in a portion around the center of the first mirror in a direction perpendicular to the advancement direction of the SR light is $r_x$, and the distance between the center of the first mirror and a virtual plane, with the line of intersection of the virtual plane with the SR light as reflected by the first mirror being a straight line parallel to the SR orbital plane is $l$, which is given by:

$$l = l_2 + a \times l_3/2 \quad (0 \leq a \leq 1) \tag{1}$$

wherein the curvature radius $r_z$ of the first mirror with respect to the advancement direction of the SR light may be as follows:

$$r_z = (l_1 \times l)/[\{l_1 + 2 \times l\{l - (l_1 \sin\theta)/r_x\}\}] \tag{2}$$

Another embodiment of the present invention may be arranged so that: the distance from the emission point of an SR light source to the center of a first mirror is $l_1$, the distance from the center of the first mirror to the center of a second mirror is $l_2$, the distance from the center of the second mirror to a mask is $l_3$, an oblique incidence angle defined between a principal ray of SR light and a tangent in the principal ray direction at a central portion on the first mirror is $\theta$, a curvature radius in a portion around the center of the first mirror in a direction perpendicular to the advancement direction of the SR light is $r_{x0}$, a curvature radius of the first mirror with respect to the advancement direction of the the SR light is $r_z$, and the distance between the center of the first mirror and a virtual plane, with the line of intersection of the virtual plane with the SR light as reflected by the first mirror being a straight line parallel to the SR orbital plane is $l$, which is given by:

$$l = l_2 + a \times l_3/2 \quad (0 \leq a \leq 1) \tag{3}$$

wherein, when the center of the first mirror with respect to the advancement direction of the SR light is taken as an origin and the distance from the origin in the SR light advancement direction is z (with the direction toward the second mirror being taken as positive), $r_z'$ is given as follows:

$$r_z' = (l_1 \times l)/[\{l_1 + 2 \times l\{l - (l_1 \sin\theta)/r_{x0}\}\}] \sin\theta \tag{4}$$

and also a coefficient $r_{x1}$ is given as follows:

$$r_{x1} = -(r_x/\tan\theta)(l/r_z - l/r_z') \tag{5}$$

and wherein the radius of curvature $r_x$ with respect to a direction perpendicular to the advancement direction of SR light at the position z upon the first mirror may be set, by using the coefficient $r_{x1}$ above, to satisfy the following:

$$r_x = r_{x0} + r_{x1} \times z \tag{6}$$

In a preferred form, the second mirror may be disposed adjacent to a position, at the first mirror side, on the virtual plane having the line of intersection between it and the SR light as reflected by the first mirror being a straight line parallel to the SR orbital plane.

The reflection surface of the second mirror may have an approximately spherical or cylindrical shape.

In the structure described above, the radius of curvature of the first mirror is set so that the SR light as emitted with a large emission angle and collected by the first mirror is projected on the second mirror and that a straight line of intersection parallel to the SR orbital plane is defined upon a virtual plane which is adjacent to the second mirror and is perpendicular to the direction of emission of the reflected SR light. As a result of this arrangement, the SR light as reflected by the second mirror can be projected on a mask with less non-uniformness.

When the second mirror is formed with a convex surface such as an approximately spherical or cylindrical surface, the region on the mask to be irradiated with the SR light is enlarged.

Figure 2A:
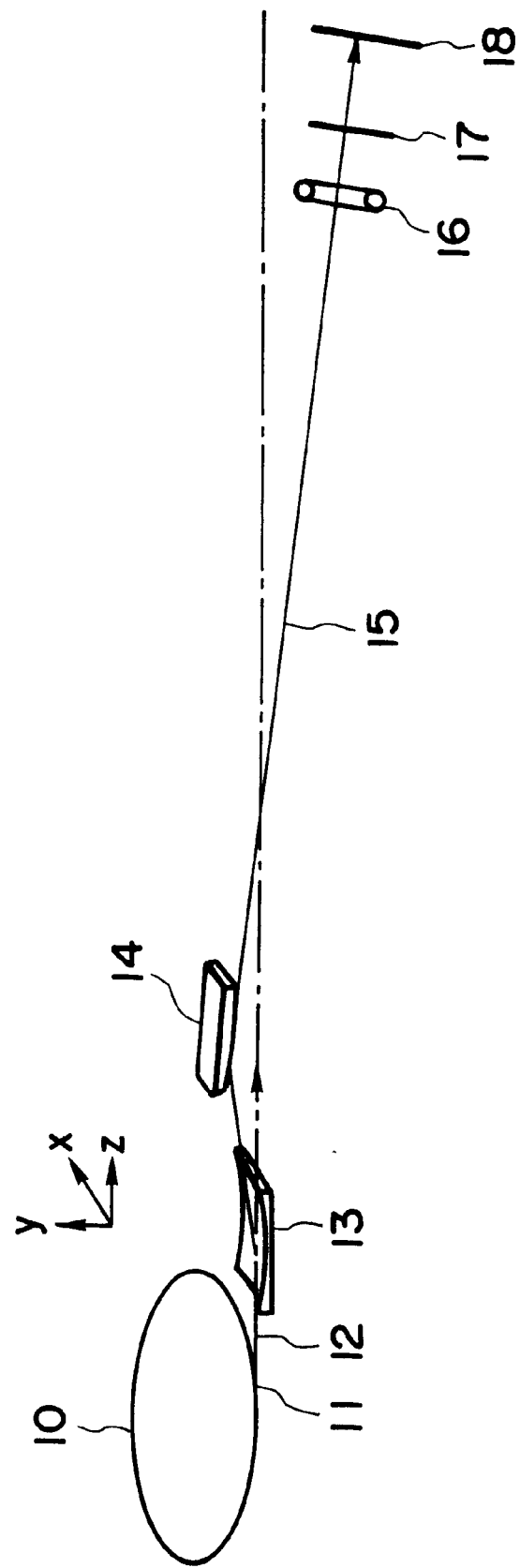
FIG. 2A is a schematic and perspective view of an exposure apparatus according to a first embodiment of the present invention.

Now, preferred embodiments of the present invention will be described with reference to the drawings. FIG. 2A is a schematic and perspective view of a first embodiment of the present invention. FIGS. 2B and 2C are schematic views for explaining the relation between the light emission point and mirrors, wherein FIG. 2B is a side view and FIG. 2C is a top plan view. Denoted in these drawings at 10 is a synchrotron radiation (SR) light source, and denoted at 11 or 21 is a light emission point. Denoted at 12 or 22 is synchrotron radiation (SR) light, and denoted at 13 or 23 is a first mirror. Denoted at 14 or 24 is a second mirror, and denoted at 15 or 25 is SR light directed to a mask. Denoted at 16 is a shutter, and denoted at 17 is an X-ray transmission window. Denoted at 18 is a mask.

An electron orbit of SR light source 10 is illustrated as a circular orbit, for simplicity. Practically, it may have a race track shape, a rectangular shape or any other shape. As the electron orbit is bent by a bending magnet, SR light 12 or 22 is emitted in a tangential direction. In this embodiment, SR light 12 or 22 emitted from the emission point 11 or 21 with a large angle is reflected by the first mirror 13 or 23 and, after that, it is reflected by the second mirror 14 or 24. The SR light reflected by the second mirror 14 or 24 is directed toward the mask 18. After this, it passes an opening of the shutter 16 for controlling the exposure amount, and then the X-ray transmission window 17. Then, it is projected on the mask 18. The SR light which passes the mask is projected on a wafer (not shown) which is coated with a resist.

A coordinate system is set such as shown in FIG. 2A, wherein the y axis is taken vertically and upwardly along the SR orbital plane, wherein the z axis is taken along a tangent to a certain point (light emission point) upon the SR electron orbit and in the direction of emission of SR light (principal ray direction of the SR light), and wherein the x axis is taken on a direction perpendicular to both the y and z axes. The x and z axes are thus included in the SR orbital plane. The center of the mask 18 is placed on a plane which is substantially x=0, that is, in the y-z plane. The SR light ray which emits in the z axis direction from the emission point is referred to as the principal ray.

The SR light comprises a beam of sheet-like electromagnetic waves having a large divergence angle with respect to a horizontal direction (direction contained in the SR orbital plane) and having a small divergence angle with respect to a vertical direction (direction perpendicular to the SR orbital plane). It contains X-rays and/or vacuum ultraviolet rays. As regards the SR light having a large divergence angle with respect to the horizontal direction, in an exact sense, it is not emitted from a single emission point but it is emitted tangentially from points on the the SR electron orbit. Here, SR light which comes from the SR electron orbit of a length sufficiently small as can be considered as a single light emission point, is regarded as SR light coming from one light emission point with a divergence angle corresponding to the length of that electron orbit.

Figure 3:
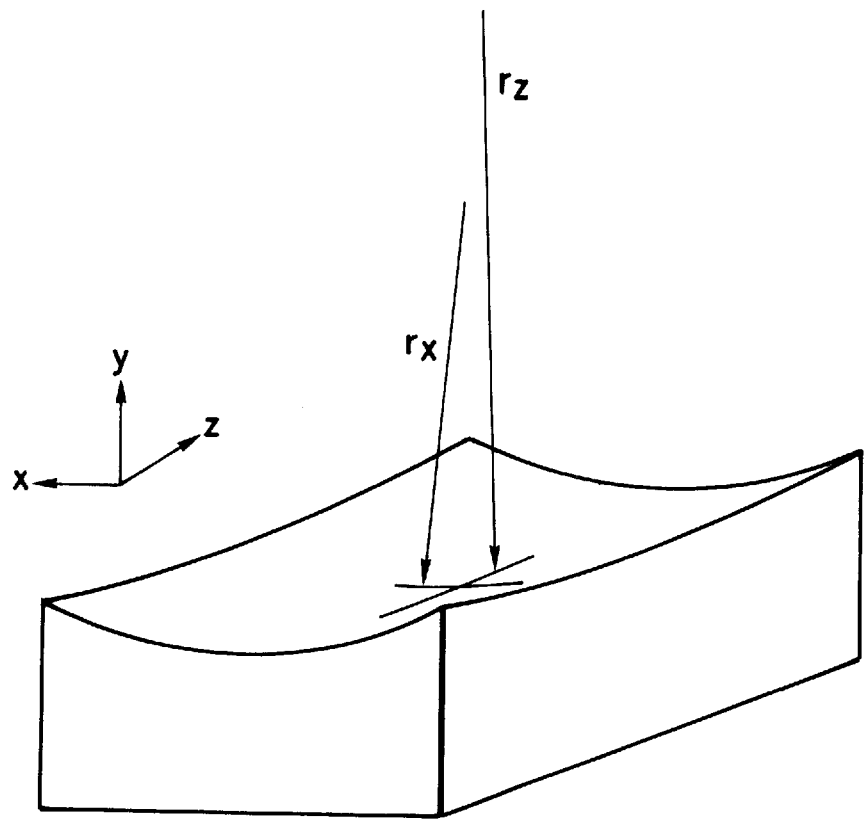
FIG. 3 is a schematic and perspective view of a a first mirror, for explaining a radius of curvature of a mirror.
Figure 4:
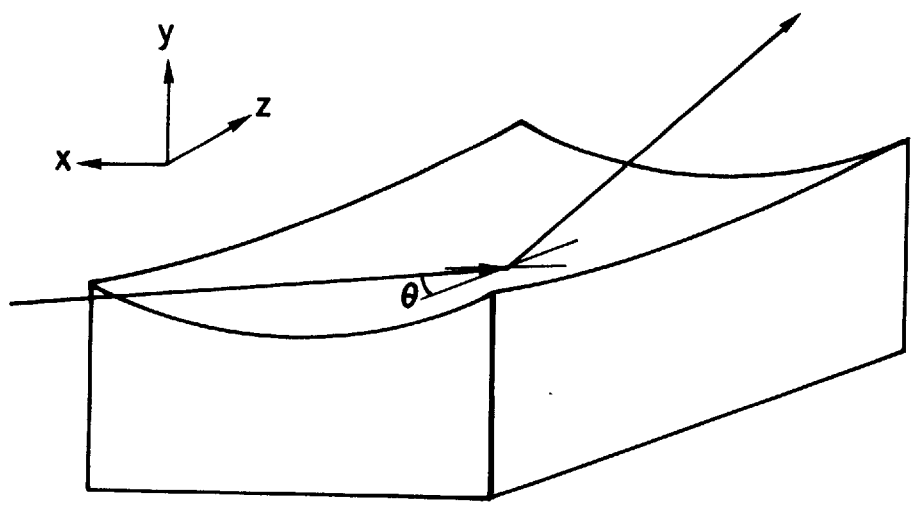
FIG. 4 is a schematic and perspective view of a first mirror, for explaining an oblique incidence angle $\theta$.
Figure 5:
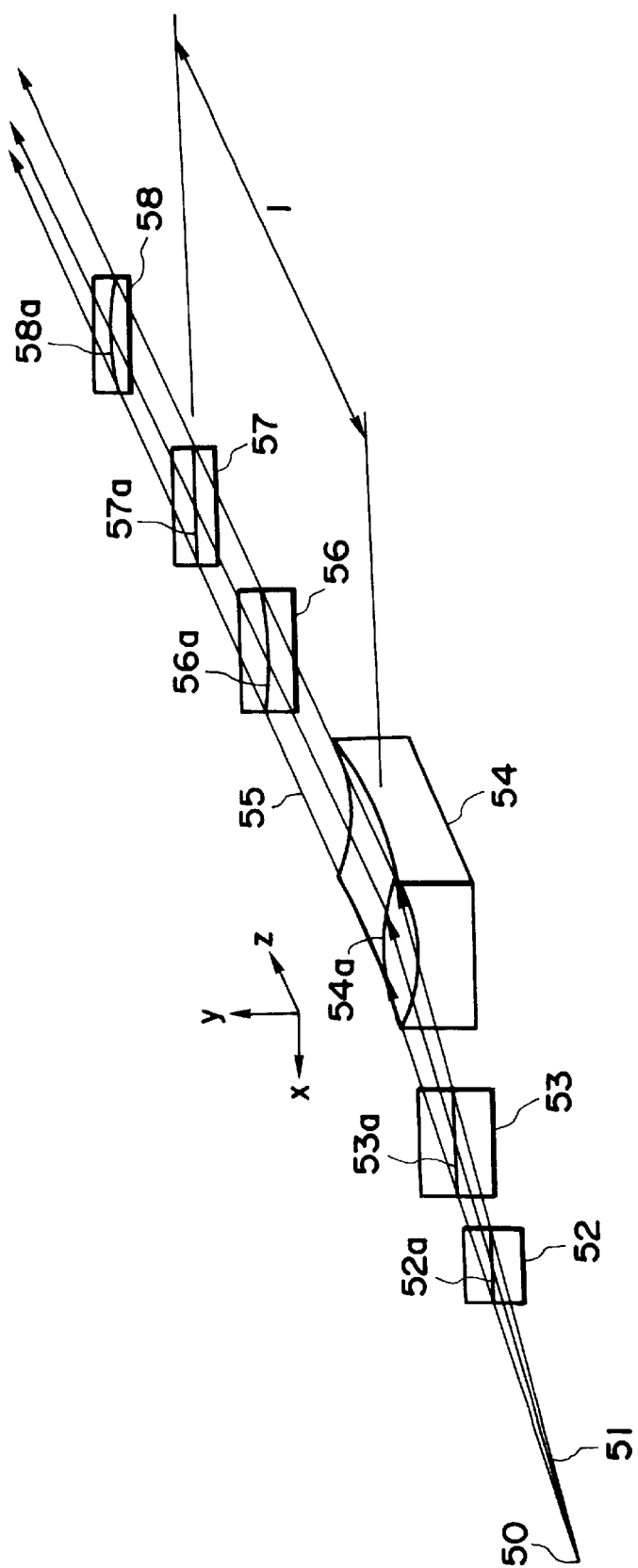
FIG. 5 is a schematic and perspective view for explaining the relation among SR light, a first mirror and a virtual plane intersecting perpendicularly to the principal ray of the SR light.

FIG. 3 is a schematic and perspective view of a first mirror, for explaining the radius of curvature of the mirror. Denoted at $r_x$ is a curvature radius in a direction perpendicular to the advancement direction of SR light within the SR plane. Denoted at $r_z$ is a curvature radius in the advancement direction of the SR light. FIG. 4 is a schematic and perspective view of a first mirror, for explaining an oblique incidence angle θ. FIG. 5 is a schematic and perspective view for explaining the relation among the SR light, the first mirror and a virtual plane which intersects perpendicularly with the SR light principal ray, in the present invention. Denoted in these drawings at 50 is a light emission point, and denoted at 51 is SR light. Denoted at 52, 53, 56, 57 and 58 each is a virtual plane which intersects perpendicularly to the SR light principal ray. Denoted at 52a, 53a, 56a, 57a and 58a each is a line of intersection between the virtual plane and the SR light. Denoted at 54 is the first mirror, and denoted at 54a is the line of intersection between the center of the first mirror and the SR light. Denoted at 55 is SR light as reflected by the first mirror.

As shown in FIG. 5, the plane which is defined by SR light 51 as emitted along the SR orbital plane from the light emission point 50, intersects virtual planes 52 and 53 perpendicular to the principal ray of SR light, along intersection lines 52a and 53a. These intersection lines 52a and 53a are straight lines parallel to the horizontal plane. The plane as defined by SR light 51 emitted along the SR orbital plane intersects with the reflection surface of the first mirror 13 (23 or 54) along an intersection line 54a. The first mirror has a shape for collecting SR light 12 (22 or 51) emitted with a large divergence angle along the SR orbital plane and reflecting it as SR light of a shape suitable for illumination of the mask. The first mirror 13 (23 or 54) has such a shape as described above and, as shown in FIG. 3, it has a curvature $r_x$ in a direction perpendicular to the principal ray, that is, in the x direction. Therefore, the intersection line 54a between the SR light 51 and the mirror 54 is not straight, but it defines a parabolic line in the vicinity of the mirror center. As a result, the plane as defined by SR light 55 emitted within the SR orbital plane and reflected by the first mirror 54 is not flat, but curved. In consideration of this, the shape of the first mirror 54 in the advancement direction of the SR light, i.e., in the z direction, may be formed with a curvature radius $r_z$ that satisfies a certain condition, i.e., the condition of equation (2), such that, at the position of a predetermined distance l from the center of the first mirror 54, the intersection line 57a between the virtual plane 57 perpendicular to the principal ray and the plane as defined by SR light 55 emitted within the SR orbital plane and reflected by the first mirror 54 becomes straight. Also, the second mirror may be disposed so that the above-described position where the intersection line becomes straight is placed between the second mirror and a middle of a distance from the second mirror to the mask. Under these conditions, at positions spaced from the center of the first mirror 54 by the distance l, as shown in FIG. 5, the intersection lines 56a and 58a of the virtual planes 56 and 58 perpendicular to the principal ray with the plane defined by the SR light 55 emitted along the SR orbital plane and reflected by the first mirror, do not become straight.

Further, the second mirror may be an approximately spherical or cylindrical surface mirror, and the second mirror may be disposed in the vicinity of the virtual plane 57, at the first mirror side thereof, which plane intersects perpendicularly with the principal ray, where the intersection line 57a intersectes with the plane defined by SR light 55 emitted within the SR orbital plane and reflected by the first mirror 54. This enables that the divergence angle, in the vertical direction, of the SR light 55 emitted within the SR orbital plane with a large angle and collected and reflected by the first mirror is expanded through the reflection by the second mirror and, as a result, the exposure region required is irradiated at once.

In an example according to this embodiment of the present invention, the distance $l_1$ from the emission point of the SR light source to the center of the first mirror is $l_1$=800 mm, the distance $l_2$ between the centers of the first and second mirrors is $l_2$=5000 mm, the oblique incidence angle $\theta$ upon the first mirror is $\theta$=15 mrad., and, in the vicinity of the center of the first mirror, $r_x$=30 mm. Thus, by setting $r_z$ as:

$$r_z = 28600 \text{ mm},$$

the condition of equation (2) is satisfied. Here, $r_x$ and $r_z$ are illustrated in FIG. 3, while $\theta$ is illustrated in FIG. 4. When the curvature radius has a positive value, the mirror has a concave surface and, if the radius has a negative value, the mirror has a convex surface.

The second mirror 14 or 24 comprises a spherical mirror of r=−30000 mm. When SR light impinges on a spherical mirror at a very small oblique incidence angle, the light is deflected largely in the advancement direction of the light. However, in a direction perpendicular to the advancement direction of light, the light is deflected little. As a result, it is enabled that the first mirror 13 or 23 collects SR light 11 or 21 emitted within the SR orbital plane with a large angle and, with respect to the direction perpendicular to the SR orbital plane, the second mirror 14 or 24 expands the light. Here, at the position where the second mirror 14 or 24 is disposed, the intersection line between the plane perpendicular to the principal ray and the plane defined by SR light 12 or 22 emitted within the SR orbital plane and reflected by the first mirror 13 or 33, is substantially straight. Therefore, the intensity is enlarged while non-uniformness of SR light projected to the mask 18 is reduced. Additionally, the region to be irradiated with SR light is enlarged.

Figure 6:
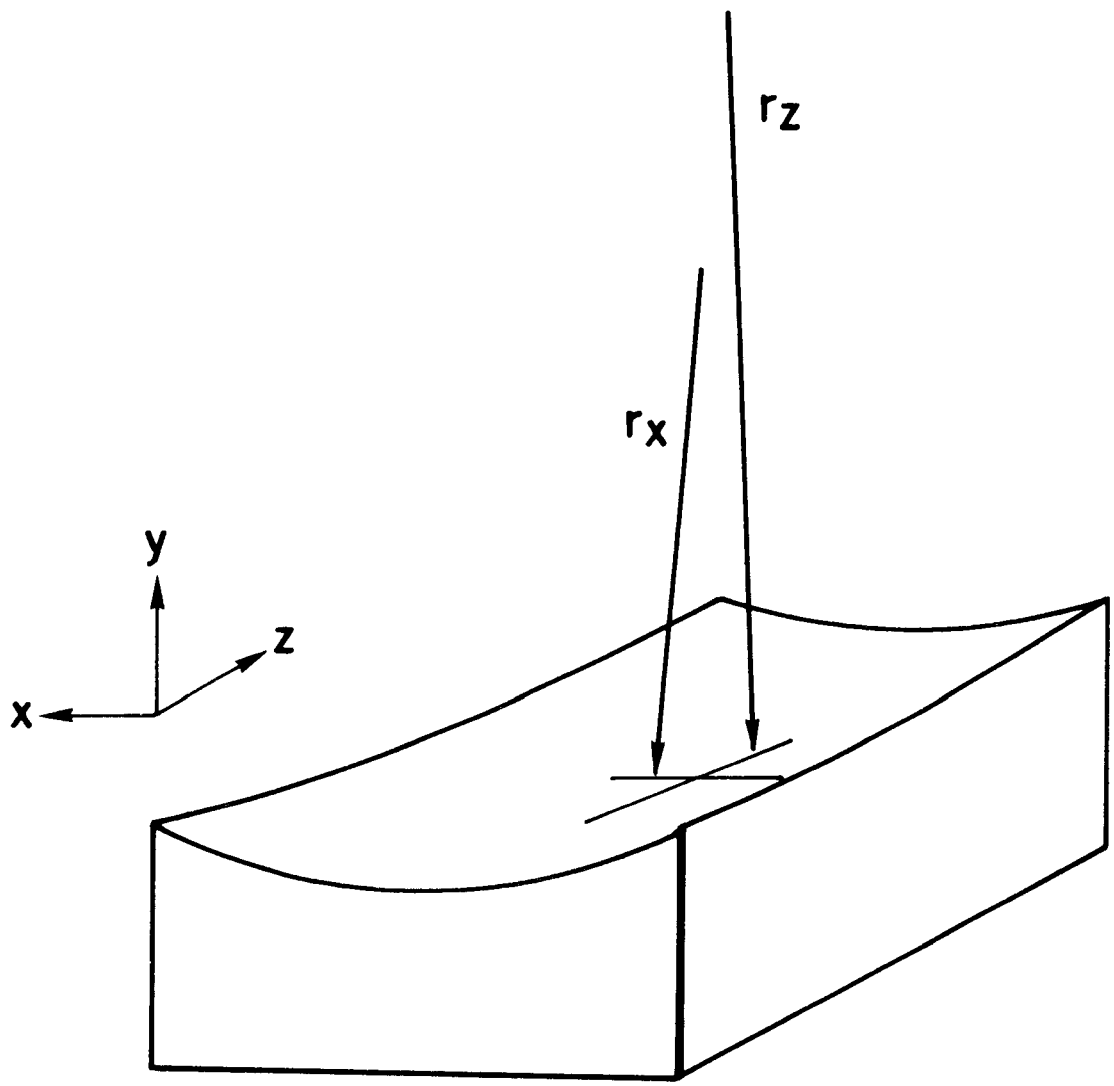
FIG. 6 is a schematic and perspective view of a first mirror, for explaining a radius of curvature of a mirror in a second embodiment of the present invention.

A second embodiment of the present invention will now be described. In the second embodiment, the curvature radius of the first mirror in the x direction varies with respect to the z direction, by which uniformization of the intensity distribution on a mask with respect to the vertical direction is assured. FIG. 6 is a schematic and perspective view of a first mirror, for explaining mirror curvature radius in the second embodiment. Denoted at $r_x$ is a curvature radius in a direction perpendicular to the advancement direction of SR light, in the SR plane, which radius changes with the position in the z direction. Denoted at $r_z$ is a curvature radius in the advancement direction of the SR light.

On the basis of curvature radius $r_x$ of the first mirror in the x direction at the position of point z as determined in accordance with equation (6) (where $r_{x1} \neq 0$, and z=0 at the mirror center in the principal ray direction) and by using the coefficient $r_{x1}$ determined in accordance with equation (5) with the use of $r_z'$ given by equation (4), when the curvature radius $r_x$ of the first mirror in the x direction changes in the z direction, at a position of distance l from the center of a the first mirror 54, the intersection line 57a between the virtual plane 57 perpendicular to the principal ray and the plane defined by SR light 55 emitted within the SR orbital plane and reflected by the first mirror 54 becomes straight. The second mirror is disposed so that the above-described position where the intersection becomes straight is placed between the second mirror and a middle between the second mirror and the mask.

Further, the second mirror may be an approximately spherical or cylindrical surface mirror, and the second mirror may be disposed in the vicinity of the virtual plane 57, at the first mirror side thereof, which plane intersects perpendicularly with the principal ray, where the intersection line 57a intersects with the plane defined by SR light 55 emitted within the SR orbital plane and reflected by the first mirror 54. This enables that the divergence angle, in the vertical direction, of the SR light 55 emitted within the SR orbital plane with a large angle and collected and reflected by the first mirror is expanded through the reflection by the second mirror and, as a result, the exposure region required is irradiated at once.

In a first example according to the second embodiment of the present invention, the distance $l_1$ from the emission point of the SR light source to the center of the first mirror is $l_1$=800 mm, the distance $l_2$ between the centers of the first and second mirrors is $l_2$=1000 mm, the distance $l_3$ from the center of the second mirror to the mask is $l_3$=5000 mm, the oblique incidence angle $\theta$ upon the first mirror is $\theta$=15 mrad., and, in the vicinity of the center of the first mirror, $r_x$=30 mm, and $r_z$=10000 mm. From equation (5), $$r_{x1} = -0.13$$

and, based on this, the curvature radius $r_x$ is changed in the z direction. Thus, as shown in FIG. 6, the curvature radius of the mirror at the mirror center decreases in the direction away from the light emission point. Also, the intersection line between the virtual plane perpendicular to the principal ray and at the position of a distance l from the center of the first mirror as set in accordance with equation (3) and the plane defined by SR light 55 emitted within the SR orbital plane and reflected by the first mirror 54 becomes a straight line parallel to the horizontal plane.

In the vicinity of the center thereof, the second mirror has r=−30000 mm. In a direction from the center to the outside, the absolute value of the curvature radius increases and the mirror surface becomes closer to a plane. Because of such a cylindrical mirror shape that ensures further uniformization of the intensity distribution on the mask in the vertical direction, it is enabled that the first mirror collects SR light emitted within the SR orbital plane with a large angle and, with respect to the direction perpendicular to the SR orbital plane, the second mirror expands the light. Here, since the second mirror is disposed in the vicinity of the position l, at the first mirror side, as determined by equation (3), the intersection line between the plane perpendicular to the principal ray and the plane defined by SR light emitted within the SR orbital plane and reflected by the first mirror is substantially straight. Therefore, the intensity is enlarged while non-uniformness of SR light projected to the mask is reduced. Additionally, the region to be irradiated with SR light is enlarged.

Figure 7A:
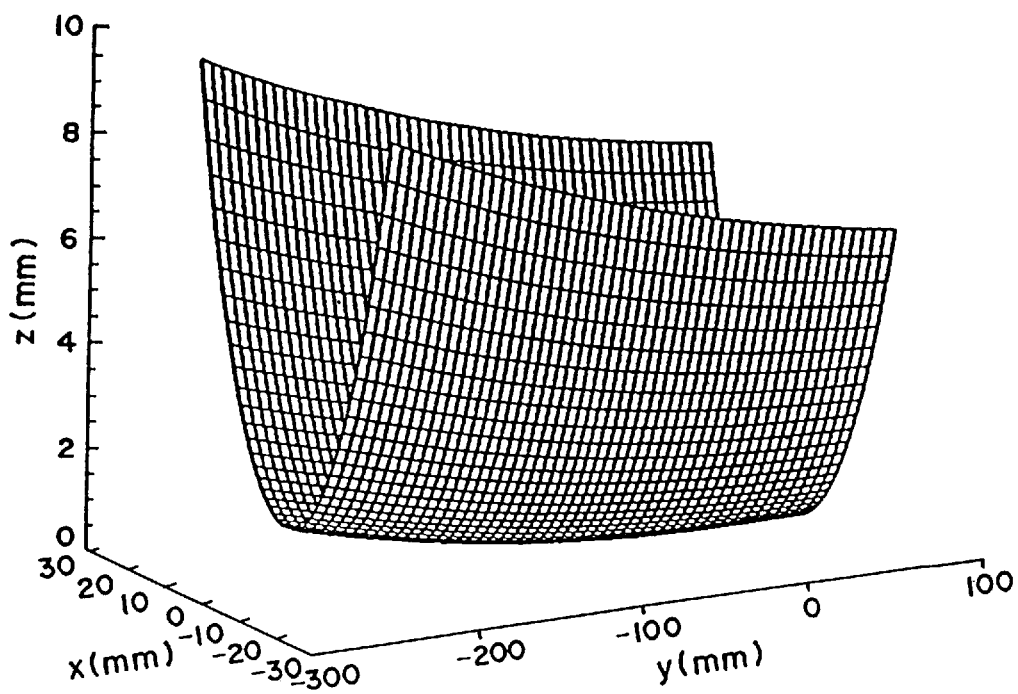
Figure 7B:
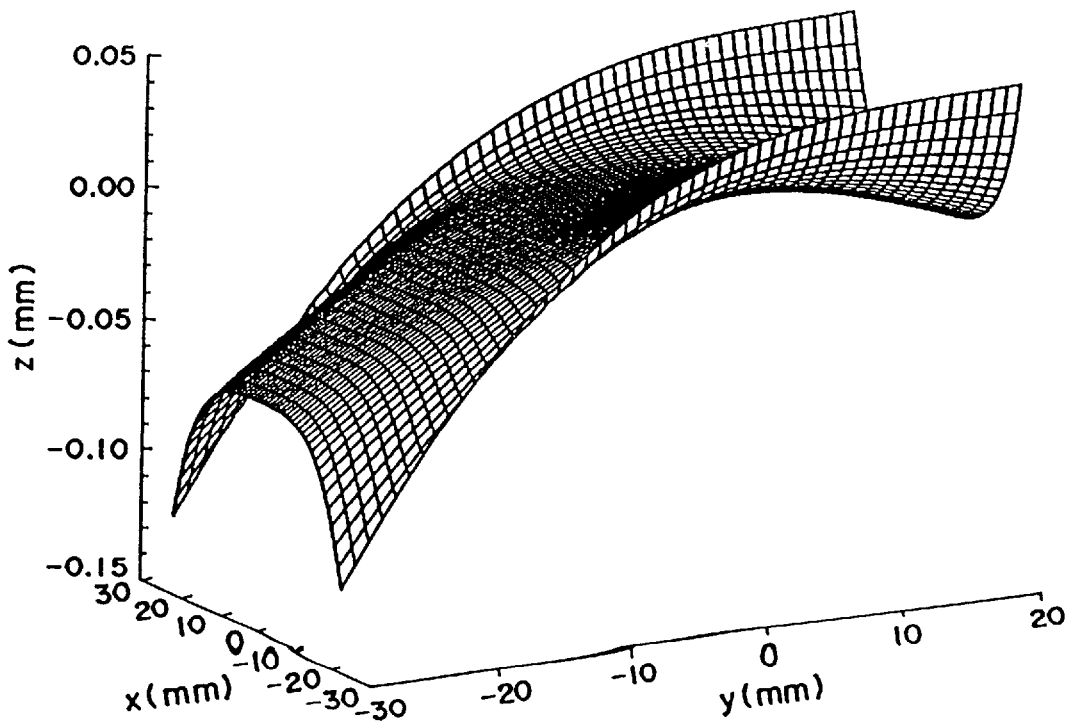
Figure 8:
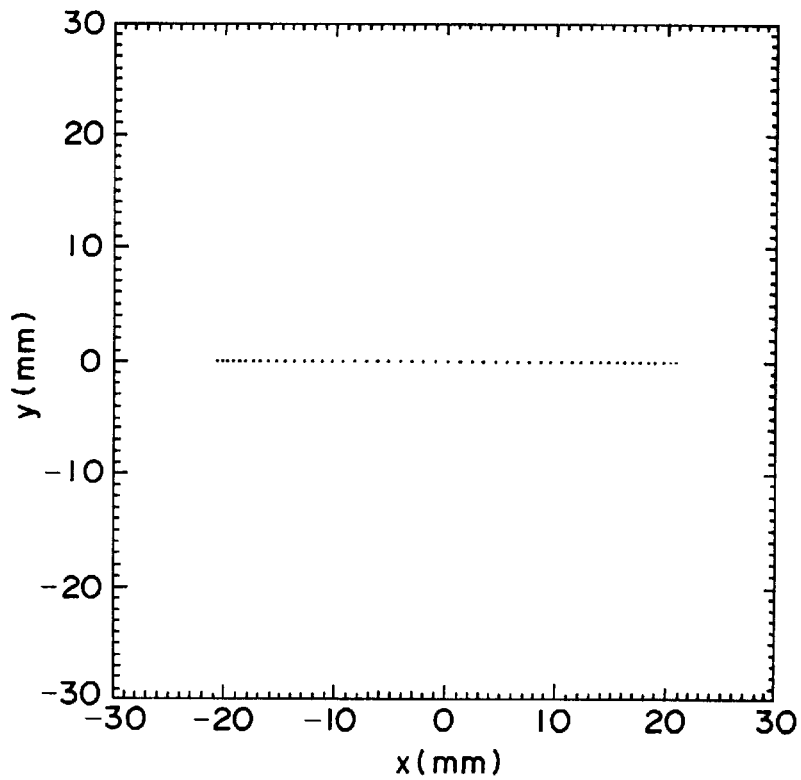
FIG. 8 is a graph for explaining a line of intersection between (i) a virtual plane which intersects perpendicularly with a principal ray at a position of l=2029.9 mm from the center of a first mirror, in the second example of the second embodiment of the present invention, and (ii) a plane defined by SR light as emitted along an SR orbital plane and reflected by the first mirror.

A second example of the second embodiment of the present invention will now be described. FIGS. 7A and 7B are three-dimensional illustrations showing the shape of a mirror of the second example of this embodiment, wherein FIG. 7A shows the shape of the first mirror and FIG. 7B shows the shape of the second mirror. FIG. 8 is a graph for explaining the line of intersection between a virtual plane perpendicular to the principal ray, at a position l=2029.9 mm from the center of the first mirror of the second example of the second embodiment, and a plane as defined by SR light emitted within the SR orbital plane and reflected by the first mirror.

In the second example, the distance $l_1$ from the emission point to the center of the first mirror is $l_1$=2000 mm, the distance $l_2$ between the centers of the first and second mirrors is $l_2$=2000 mm, the distance $l_3$ from the center of the second mirror to the mask is $l_3$=5500 mm, and the oblique incidence angle θ upon the first and second mirrors is θ=15 mrad. Also, a beryllium film having a thickness of 18 micron is set at a distance 5000 mm from the second mirror, to the mask side, as a vacuum partition wall. The mask side of this vacuum partition wall is filled with a helium gas with a pressure of 150 Torr. The mask comprises a SiC membrane having a thickness of 2 micron on which a pattern, mainly consisting of tungsten, is formed. At a gap of 20 microns from the mask membrane, there is a wafer having a coating of photosensitive material. As shown in FIG. 7A, the first mirror has $r_{x0}$=53.4 mm and $r_z$=113000 mm, about its center. Also, the curvature radius $r_x$ is changed in the z direction, with $r_{x1}$=0.0182. Thus, the curvature radius of the mirror at the center thereof increases in the direction away from the light emission point. Also, the intersection line between the virtual plane perpendicular to the principal ray and at the position of a distance l=2029.9 mm from the center of the first mirror as set in accordance with equation (3) and the plane defined by SR light 55 emitted within the SR orbital plane and reflected by the first mirror 54 becomes a straight line parallel to the horizontal plane, as shown in FIG. 8.

As shown in FIG. 7B, the second mirror has, in the vicinity of its center, $r_x$=36600 mm and $r_z$=−6700 mm. It is convex in the direction of emission of SR light, and is concave in the direction perpendicular thereto.

Figure 9:
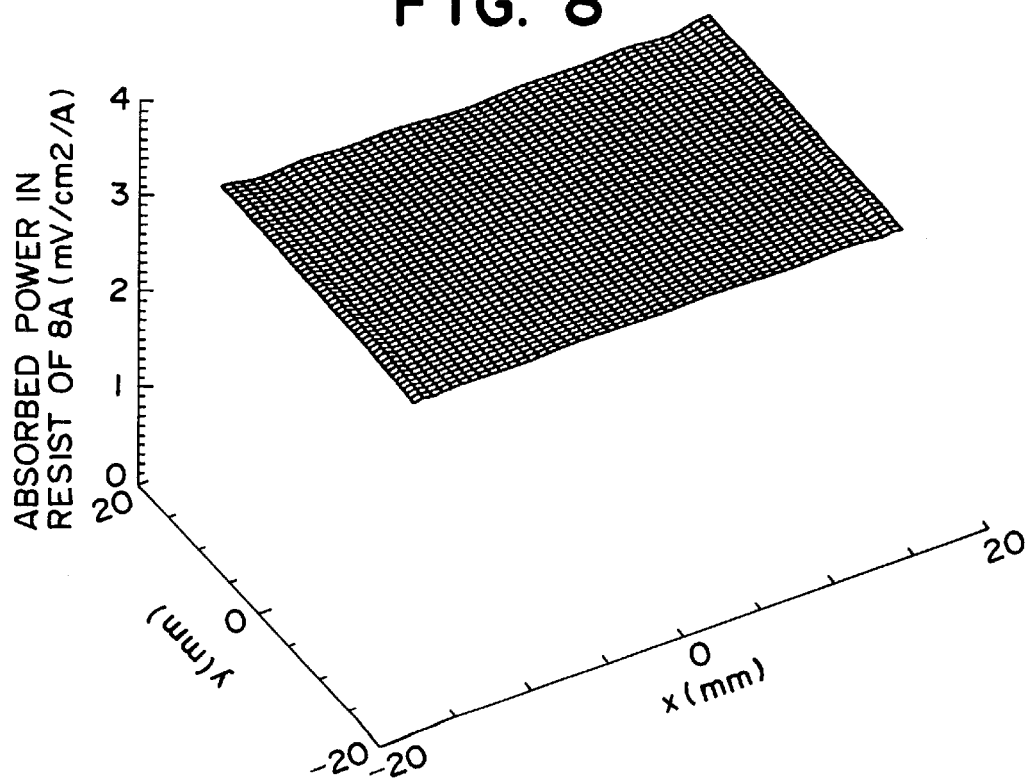
FIG. 9 is a three-dimensional shape illustration of an SR light intensity distribution to be absorbed by a photosensitive material, in the second example of the second embodiment of the present invention.

FIG. 9 is a three-dimensional illustration of the intensity distribution of SR light to be absorbed by a photosensitive material, in the second example of the second embodiment of the present invention. This embodiment provides an illumination system by which a region of 32 mm square can be irradiated with SR light and, additionally, the intensity of SR light from the mask membrane and to be absorbed by the photosensitive material is substantially uniform, over the whole region irradiated with SR light.

Figure 10A:
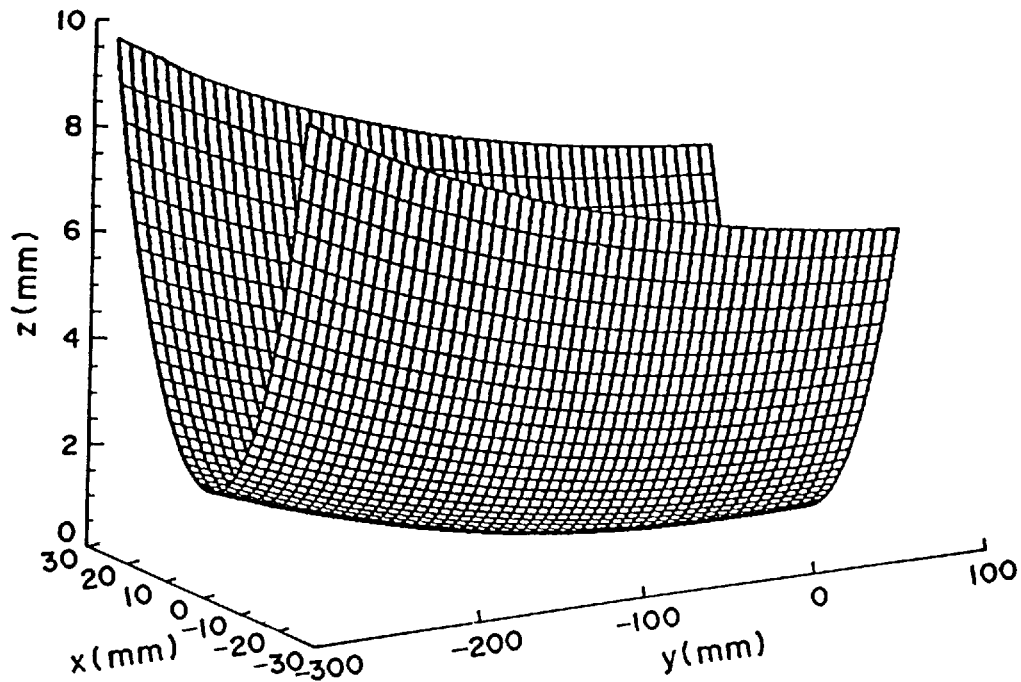
Figure 10B:
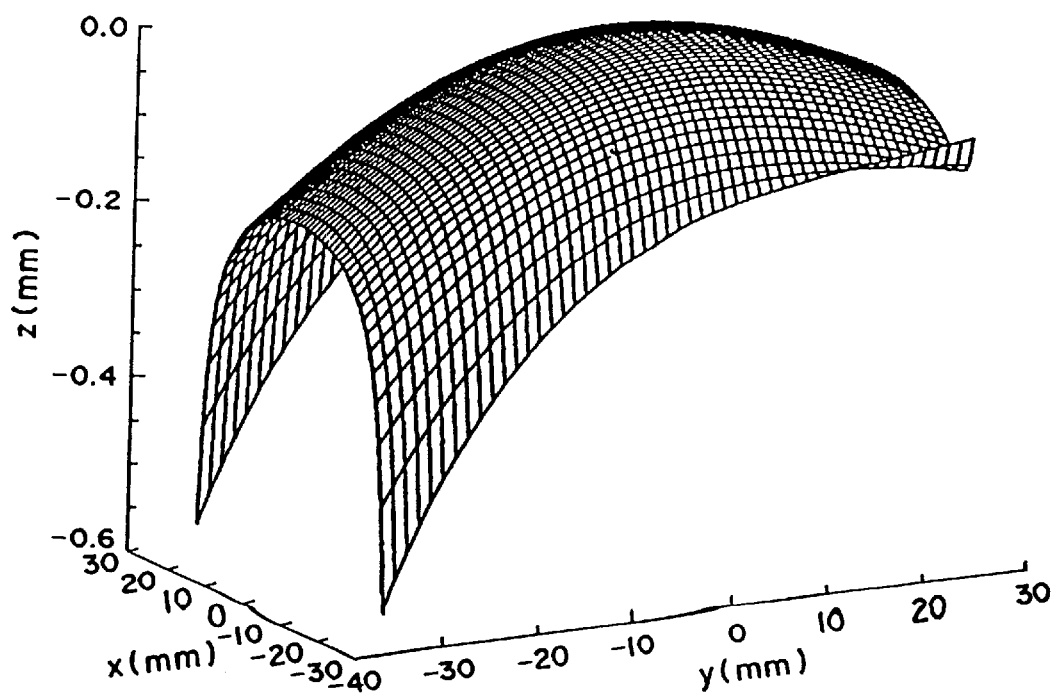
Figure 11:
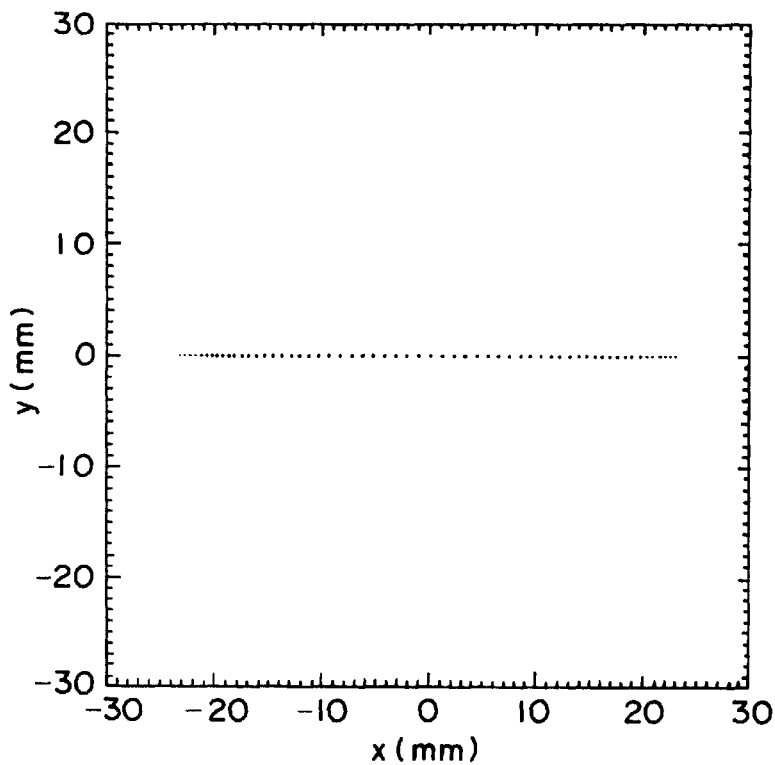
FIG. 11 is a graph for explaining a line of intersection between (i) a virtual plane which intersects perpendicularly with a principal ray at a position of l=2102.8 mm from the center of a first mirror, in the third example of the second embodiment of the present invention, and (ii) a plane defined by SR light as emitted along an SR orbital plane and reflected by the first mirror.

A third example of the second embodiment of the present invention will now be described. FIGS. 10A and 10B are three-dimensional illustrations for explaining the mirror shape in the third example of the second embodiment, wherein FIG. 10A shows the shape of a first mirror and FIG. 10B shows the shape of a second mirror. FIG. 11 is a graph for explaining the line of intersection between a virtual plane perpendicular to the principal ray, at a position l=2102.8 mm from the center of the first mirror of the third example of the second embodiment, and a plane as defined by SR light emitted within the SR orbital plane and reflected by the first mirror.

In the third example, the distance $l_1$ from the emission point to the center of the first mirror is $l_1$=2000 mm, the distance $l_2$ between the centers of the first and second mirrors is $l_2$=2000 mm, the distance $l_3$ from the center of the second mirror to the mask is $l_3$=5500 mm, and the oblique incidence angle θ upon the first and second mirrors is θ=15 mrad. Also, a beryllium film having a thickness of 18 microns is set at a distance of 5000 mm from the second mirror, to the mask side, as a vacuum partition wall. The mask side of this vacuum partition wall is filled with a helium gas with a pressure of 150 Torr. The mask comprises a SiC membrane having a thickness of 2 micron on which a pattern, mainly consisting of tungsten, is formed. At a gap of 20 microns from the mask membrane, there is a wafer having a coating of a photosensitive material. As shown in FIG. 10A, the first mirror has $r_{x0}$=56.3 mm and $r_z$=89000 mm, about its center. Also, the curvature radius $r_x$ is changed in the z direction, with $r_{x1}$=0.0109. Thus, the curvature radius of the mirror at the center thereof increases in the direction away from the light emission point. Also, the intersection line between the virtual plane perpendicular to the principal ray and at the position of a distance l=2102.8 mm from the center of the first mirror as set in accordance with equation (3) and the plane defined by SR light 55 emitted within the SR orbital plane and reflected by the first mirror 54 becomes a straight line parallel to the horizontal plane, as shown in FIG. 11.

As shown in FIG. 10B, the second mirror has, in the vicinity of its center, $r_x$=−4893 mm and $r_z$=−13500 mm. It is convex in the direction of emission of the SR light, and also is convex in the direction perpendicular thereto.

Figure 12:
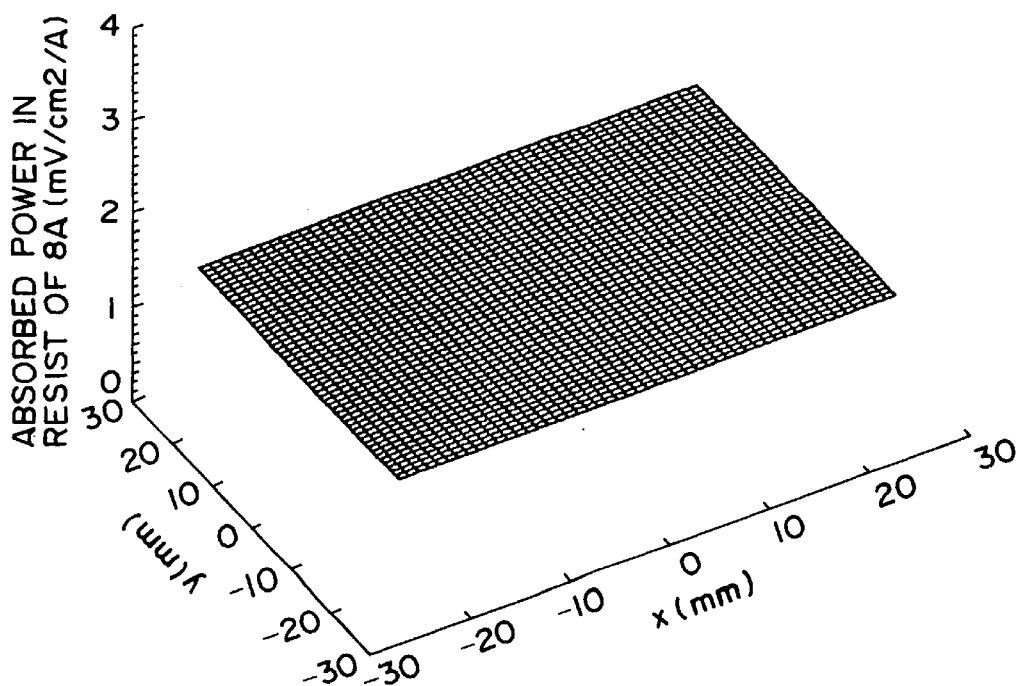
FIG. 12 is a three-dimensional shape illustration of an SR light intensity distribution to be absorbed by a photosensitive material, in the third example of the second embodiment of the present invention.

FIG. 12 is a three-dimensional illustration of an intensity distribution of SR light to be absorbed by a photosensitive material, in the third example of the second embodiment of the present invention. This embodiment provides an illumination system by which a region of 50 mm square can be irradiated with SR light and, additionally, the intensity of SR light from the mask membrane and to be absorbed by the photosensitive material is substantially uniform, over the whole region irradiated with SR light.

In the embodiments of the present invention as described above, a mask can be illuminated by collecting light which is emitted from an emission point in a horizontal direction, with a large divergence angle, which is not utilized with the conventional method (2) or (3) described hereinbefore. Thus, the efficiency of SR light utilization is improved, and the throughput of semiconductor manufacture increases. Further, by projecting SR light to the whole mask surface, it is effective to avoid degradation of registration precision due to thermal distortion of the mask, thus increasing the yield. Additionally, the reliability of the semiconductor device produced is improved.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing an object with X-rays from a synchrotron radiation light source, said apparatus comprising:

a first mirror for collecting and reflecting synchrotron radiation light emitted from a synchrotron radiation orbit; and a second mirror for receiving synchrotron radiation light reflected by said first mirror and for projecting it toward the object, said second mirror having a reflection surface which is convex with respect to a direction of emission of synchrotron radiation light as reflected by said first mirror, wherein, when a virtual plane perpendicular to the direction of emission of the synchrotron radiation light reflected by said first mirror is set between a center position of said second mirror and an intermediate position between the center position of said second mirror and the position of the object, said first mirror has a reflection surface of a curvature determined so that a line of intersection between the virtual plane and the synchrotron radiation light from said first mirror becomes parallel to the synchrotron radiation orbit.

2. An apparatus according to claim 1, wherein the distance from an emission point of the synchrotron radiation light source to the center of said first mirror is $l_1$, the distance from the center of said first mirror to the center of said second mirror is $l_2$, the distance from the center of the second mirror to the object is $l_3$, an oblique incidence angle defined between a principal ray of the synchrotron radiation light and a tangent in a principal ray direction at a central portion on said first mirror is θ, a curvature radius in a portion around the center of said first mirror in a direction perpendicular to the advancement direction of the synchrotron radiation light is $r_x$, and the distance between the center of said first mirror and said virtual plane, with its line of intersection with the synchrotron radiation light as reflected by said first mirror being a straight line parallel to the synchrotron radiation orbital plane is l, which is given by $l=l_2+a \times l_3/2$ (0≦a≦1), the curvature radius $r_z$ of said first mirror with respect to the advancement direction of the synchrotron radiation light is set to satisfy a relation:

$$r_z = (l_1 \times l)/[\{l_1+2 \times l\{l-(l_1 \sin \theta)/r_x\}\}] \sin \theta.$$

3. An apparatus according to claim 1, wherein the distance from an emission point of the synchrotron radiation light source to the center of said first mirror is $l_1$, the distance from the center of said first mirror to the center of said second mirror is $l_2$, the distance from the center of said second mirror to the object is $l_3$, an oblique incidence angle defined between a principal ray of the synchrotron radiation light and a tangent in a principal ray direction at a central portion on said first mirror is θ, a curvature radius in a portion around the center of said first mirror in a direction perpendicular to the advancement direction of the synchrotron radiation light is $r_{x0}$, a curvature radius of said first mirror with respect to the advancement direction of the synchrotron radiation light is $r_z$, and the distance between the center of said first mirror and a virtual plane, with its line of intersection with the synchrotron radiation light as reflected by said first mirror being a straight line parallel to a synchrotron radiation orbital plane is l, which is given by $l=l_2+a \times l_3/2 (0 \leq a \leq 1)$, wherein, when the center of said first mirror with respect to the advancement direction of the synchrotron radiation light is taken as an origin and the distance from the origin in the synchrotron radiation light advancement direction is z, with the direction toward the second mirror being taken as positive, $r_z'$ is given by:

$$r_z' = (l_1 \times l)/[\{l_1+2 \times l\{l-(l_1 \sin \theta)/r_{x0}\}\}] \sin \theta$$

wherein a coefficient $r_{x1}$ is given by:

$$r_{x1} = -(r_x/\tan \theta)(l/r_z - l/r_z')$$

and wherein the radius of curvature $r_x$ with respect to a direction perpendicular to the advancement direction of the synchrotron radiation light at position z upon said first mirror is set, by using the coefficient $r_{x1}$, to satisfy the following relation:

$$r_x = r_{x0} + r_{x1} \times z.$$

4. An apparatus according to claim 1, wherein said second mirror is disposed in the vicinity of the virtual plane having its line of intersection with the synchrotron radiation light from said first mirror being parallel to the synchrotron radiation orbital plane.

5. An apparatus according to claim 1, wherein said second mirror has a reflection surface of an approximately spherical shape.

6. An apparatus according to claim 1, wherein said second mirror has a reflection surface of an approximately cylindrical shape.

7. An apparatus according to claim 1, wherein the object to be exposed comprises a mask to be used with a wafer having a resist coating.

8. An apparatus according to claim 1, further comprising a shutter for performing exposure amount control, being disposed on a path of synchrotron radiation light from said second mirror.

9. An apparatus according to claim 1, further comprising an X-ray transmission window disposed on a path of synchrotron radiation light from said second mirror.

10. An exposure apparatus for exposing a mask with X-rays from a synchrotron radiation light source to transfer a pattern of the mask onto a photosensitive material, said apparatus comprising:

a first mirror for collectively reflecting synchrotron radiation light emitted from a synchrotron radiation orbit light source, said first mirror having a surface that is concave with respect to a direction of emission of the synchrotron radiation light from the synchrotron radiation light source and also is concave with respect to a direction perpendicular to the direction of emission; and a second mirror for receiving synchrotron radiation light reflected by said first mirror and for directly illuminating the mask, said second mirror having a surface that is convex with respect to a direction of emission of the synchrotron radiation light reflected by said first mirror, wherein synchrotron radiation reflected from said second mirror is projected directly onto the surface of the mask, free from intervention by another reflection surface.

11. An apparatus according to claim 10, wherein said second mirror has a reflection surface of an approximately spherical shape.

12. An apparatus according to claim 10, wherein said second mirror has a reflection surface of an approximately cylindrical shape.

13. An apparatus according to claim 10, wherein the object comprises a mask for use with synchrotron radiation light and with a wafer having a resist coating.

14. An apparatus according to claim 10, further comprising a shutter, disposed on a path of the synchrotron radiation light from said second mirror, for controlling an exposure amount.

15. An apparatus according to claim 10, further comprising an X-ray transmission window disposed on a path of the synchrotron radiation light from said second mirror.

* * * * *

UNITED STATES PATENT AND TRADEMARK OFFICE
CERTIFICATE OF CORRECTION

PATENT NO. : 5,949,844

DATED : September 7, 1999

INVENTOR : YUTAKA WATANABE

It is certified that error appears in the above-identified patent and that said Letters Patent is hereby corrected as shown below:

COLUMN 4:
Line 29, "0" should read --$\theta$--.

COLUMN 6:
Line 66, "intersectes" should read --intersects--.

COLUMN 11:
Line 15, "($l_1$ sin $\theta/r_x$}] sin $\theta$." should read
--$l_1$ sin $\theta/r_x$}] sin $\theta$--.

Signed and Sealed this

Twenty-fourth Day of October, 2000

Attest:

Q. TODD DICKINSON

*Attesting Officer*     *Director of Patents and Trademarks*